United States Patent
Bartram

(10) Patent No.: US 9,331,636 B2
(45) Date of Patent: May 3, 2016

(54) TIME AND AMPLITUDE ALIGNMENT IN ENVELOPE TRACKING AMPLIFICATION STAGE

(75) Inventor: Ben Bartram, Cambourne (GB)

(73) Assignee: SNAPTRACK, INC., San Diego, CA (US)

( * ) Notice: Subject to any disclaimer, the term of this patent is extended or adjusted under 35 U.S.C. 154(b) by 80 days.

(21) Appl. No.: 14/117,989

(22) PCT Filed: May 16, 2012

(86) PCT No.: PCT/EP2012/059183
§ 371 (c)(1),
(2), (4) Date: Feb. 25, 2014

(87) PCT Pub. No.: WO2012/156470
PCT Pub. Date: Nov. 22, 2012

(65) Prior Publication Data
US 2015/0035606 A1    Feb. 5, 2015

(30) Foreign Application Priority Data
May 16, 2011    (GB) .................................. 1108103.1

(51) Int. Cl.
| | |
|---|---|
| H03G 3/20 | (2006.01) |
| H03F 1/02 | (2006.01) |
| G01R 21/00 | (2006.01) |
| H03F 3/19 | (2006.01) |
| H03F 3/21 | (2006.01) |

(52) U.S. Cl.
CPC .............. *H03F 1/0233* (2013.01); *G01R 21/00* (2013.01); *H03F 1/0222* (2013.01); *H03F 3/19* (2013.01); *H03F 3/21* (2013.01); *H03F 2200/102* (2013.01); *H03F 2200/105* (2013.01); *H03F 2200/228* (2013.01); *H03F 2200/324* (2013.01); *H03F 2200/451* (2013.01)

(58) Field of Classification Search
CPC .................................... H03G 3/20; H03G 3/30
USPC .................................. 330/136, 129, 297, 279
See application file for complete search history.

(56) References Cited

U.S. PATENT DOCUMENTS 7,447,485 B2    11/2008    Ishikawa et al.
7,522,676 B2    4/2009    Matero
(Continued)

OTHER PUBLICATIONS

"Related International Application No. PCT/EP2012/059183", "International Preliminary Report on Patentability", Nov. 28, 2013, Publisher: PCT, Published in: EP.
(Continued)

*Primary Examiner* — Henry Choe

(57) ABSTRACT

The invention relates to a method of calibrating an envelope path and an input path of an amplification stage including an envelope tracking power supply, the method comprising: generating input signals having a known relationship for each of the input and envelope paths; and varying an amplitude and a delay of the signal in one of the envelope and input paths in order to reduce the variation in the power detected in a signal at the output of the amplification stage.

20 Claims, 3 Drawing Sheets

(56) References Cited

U.S. PATENT DOCUMENTS

| | | |
|---|---|---|
| 7,551,688 B2 * | 6/2009 | Matero et al. .................. 375/297 |
| 7,596,184 B2 | 9/2009 | Ahmed |
| 7,813,444 B2 | 10/2010 | Shakeshaft |
| 2005/0069026 A1 | 3/2005 | Vepsalainen et al. |
| 2005/0110568 A1 | 5/2005 | Robinson et al. |
| 2008/0080640 A1 | 4/2008 | Rofougaran |
| 2008/0268799 A1 | 10/2008 | McCune et al. |
| 2009/0045872 A1 * | 2/2009 | Kenington .................... 330/127 |
| 2010/0060358 A1 | 3/2010 | Nentwig |
| 2011/0151806 A1 * | 6/2011 | Kenington .................... 455/101 |

OTHER PUBLICATIONS

"Parent GB Patent Application No. GB1108103.1 Search Report", Sep. 9, 2011, Publisher: GB IPO, Published in: GB.

Marie Ghilini, "Related International Patent Application No. PCT/EP2012/059183 International Search Report and Written Opinion", Oct. 4, 2012, Publisher: PCT, Published in: EP.

Chinese Office Action in corresponding application No. 201280035102.6 dated Dec. 3, 2015.

* cited by examiner

TIME AND AMPLITUDE ALIGNMENT IN ENVELOPE TRACKING AMPLIFICATION STAGE

BACKGROUND TO THE INVENTION

1. Field of the Invention

The present invention relates to an amplification stage in which an envelope tracking (ET) modulator is utilised to provide a power supply to an RF amplifier.

2. Description of the Related Art

With reference to FIG. 1 there is illustrated components of a known RF amplification architecture in which an envelope tracking (ET) modulator is used to provide a power supply to a radio frequency (RF) power amplifier.

As illustrated in FIG. 1, an RF power amplifier 102 receives an RF input signal to be amplified on an input line 136, and receives a modulated power supply voltage $V_{supply}$ on line 138. The RF power amplifier 102 generates an RF output signal on line 140. An example implementation of such an RF power amplifier is in mobile communication systems, with the RF output on line 140 connected to the front end of radio transmission equipment.

As illustrated in FIG. 1, an envelope signal representing the envelope of the RF input signal to be amplified is converted by a digital-to-analogue converter 126a into an analogue signal, filtered by an optional envelope filter 128a, and then provided as an input to an ET modulator 108. The output of the ET modulator 108 forms an input to an output filter 106, and a modulated supply voltage is then provided through a supply feed 104 to provide the supply voltage on line 138.

Baseband I and Q signals are converted into analogue signals via respective digital-to-analogue converters 126b and 126c, and optionally filtered through respective I and Q filters 128b and 128c. The filtered I and Q signals are provided as inputs to a vector modulator, illustrated as respective multipliers 130a and 130b and a combiner 132. The combined output of the combiner 132 forms an input to a variable gain amplifier 134, the output of which forms an input to an optional interstage surface acoustic wave (SAW) filter 112. The output of the filter 112 provides the RF input signal to be amplified on input line 136 to the RF power amplifier 102.

The generation of the envelope signal and the I and Q baseband signals is known to one skilled in the art. Various techniques for the generation of such signals may be implemented. In FIG. 1 signal generation block 122 generally denotes the generation of these signals.

As known in the art, the path which the envelope signal follows from the digital-to-analogue converter 126a to generation of the supply voltage on line 138 to the power amplifier 102 suffers from delays and attenuation which vary on a unit by unit basis within a production tolerance. As also known in the art the path which the baseband signals follow from the digital-to-analogue converters 126b and 126c to generation of the RF input signal to be amplified on line 136 suffers from delays and attenuation.

In general, such delays and attenuation need to be controlled so as to ensure that they fall within certain tolerances, usually smaller than the production tolerances, to ensure maximum operating efficiency of the power amplifier and to ensure certain spectral emissions requirements are met (such as a minimum distortion of the amplified output signal). To achieve this, the signal processing in the envelope path prior to magnitude calculation must match that through the input (RF) path accurately and precisely. Further, the relationship between the amplitude of the signal in the envelope path and the amplitude of the signal in the input path must be correctly aligned.

In the envelope path delays may be introduced by several stages, such as the filter 128a, the output filter 106, and the supply feed 104. In addition, as denoted by an internal delay block 110 of the ET modulator 108, delays may arise in the ET modulator 108 itself. It should be noted that block 110 is illustrative of delays suffered in the ET modulator 108, and is not representative of specific circuitry or functionality of the ET modulator 108, which is not shown as it is not relevant to the present invention.

In the RF path delays may also be introduced by several stages, such as the respective I and Q filters 128b and 128c, and in the inter-stage SAW filter 112.

Amplitude errors may be introduced in an amplifier stage 150 of the envelope tracking modulator, the amplitude stage 134 of the input path, and in the supply feed network 104 to the amplifier. The filters 126b and 126c in the input path, and the filter 126a in the envelope path, are also sources of amplitude errors.

It is an aim of the present invention to provide an improved technique for controlling the relative delay and amplitude between the RF and envelope paths.

SUMMARY OF THE INVENTION

The invention provides a technique for the relative signal delay and relative amplitude attenuation between the two paths to be controlled.

In one aspect the invention provides a method of calibrating an envelope path and an input path of an amplification stage including an envelope tracking power supply, the method comprising: generating input signals having a known relationship for each of the input and envelope paths; and varying an amplitude and a delay of the signal in one of the envelope and input paths in order to reduce the variation in the power detected in a signal at the output of the amplification stage.

The input path may be defined as a path along which a signal is delivered to a signal input of an amplifier of the amplification stage. The envelope path may be defined as a path along which a signal is delivered to a power supply input of the amplifier. The envelope path may include an envelope detector for generating a signal representing the envelope of a signal to be amplified. The envelope path may include a modulator for generating a voltage supply for the amplifier.

The method may further comprise varying the delay in the one path to determine the delay minimising the variation in detected power and varying the amplitude in the one path to determine the amplitude minimising the variation in detected power. The method may further comprise varying the amplitude with the delay set at that determined to minimise variation in detected power or varying the delay with the amplitude set at that determined to minimise variation in detected power.

The method may further comprise repeating each determination.

The method may further comprise varying one of the relative delay or relative amplitude between the paths over a plurality of values; detecting the power at the output of the amplification stage for each value; determining the value of the relative delay or relative amplitude which generates the minimum detected output power variation; applying the determined value; varying the other of the relative delay or relative amplitude between the paths over a plurality of values; detecting the power at the output of the amplification stage for each value; and determining the value of the other of the relative delay or relative amplitude which generates the minimum detected output power variation.

The steps of varying each of the relative delay and the relative amplitude may comprise varying the delay and amplitude of the signal in one path whilst applying no variation to the signal in the other path.

The generated input signals for the input and envelope paths may be correlated.

The method may further comprise applying a sinusoidal signal to each of the envelope and input paths, wherein the applied signals in each path are 180° out of phase with each other.

The method may further comprise the steps of determining the delay and amplitude variations in the one path minimising the variation in the detected output power; and setting the delay and amplitude variations in the one path corresponding to such.

In another aspect the invention provides an amplification stage including an amplifier and an envelope tracking power supply, and having an input path and an envelope path, the amplification stage comprising a signal generator arranged to generate a signal on each of the input and envelope paths having a known relationship, and a detector for detecting the power in a signal at the output of the amplifier, the signal generator being adapted to vary the delay and amplitude of the signal in one of the envelope and input paths in order to reduce the variation in the power detected in the signal at the output.

The signal generator may be adapted to vary the delay and the amplitude in separate stages of operation.

The amplification stage may further include a measurement block for measuring the power variation of the output signal.

The signal generator may be adapted to generate the signal on one of the input or envelope paths for a plurality of delay values, and the measurement block is adapted to measure the output power variation for each delay value, the measurement block being further adapted to determine the delay value associated with the minimum detected power variation.

The measurement block may be further adapted to apply the determined delay value.

The signal generator may be adapted to generate the signal on one of the input or envelope paths for a plurality of amplitude values, and the measurement block is adapted to measure the output variation for each amplitude value, the measurement block being further adapted to determine the amplitude value associated with the minimum detected power variation.

The measurement block may be further adapted to apply the determined amplitude value.

The signal generator may be arranged to generate the signal on each of the input and envelope paths with a correlation therebetween.

The signal generator may be arranged to generate a sinusoidal signal on each of the input and envelope paths which are 180° out of phase.

The amplification stage may be further adapted to set the delay and amplitude variations in the one path determined to minimise the variation in the power detected in the output. The amplification stage may be an RF amplification stage.

BRIEF DESCRIPTION OF THE FIGURES

The invention will now be described by way of example with reference to the accompanying Figures in which.

DESCRIPTION OF THE PREFERRED EMBODIMENTS

Figure 1:
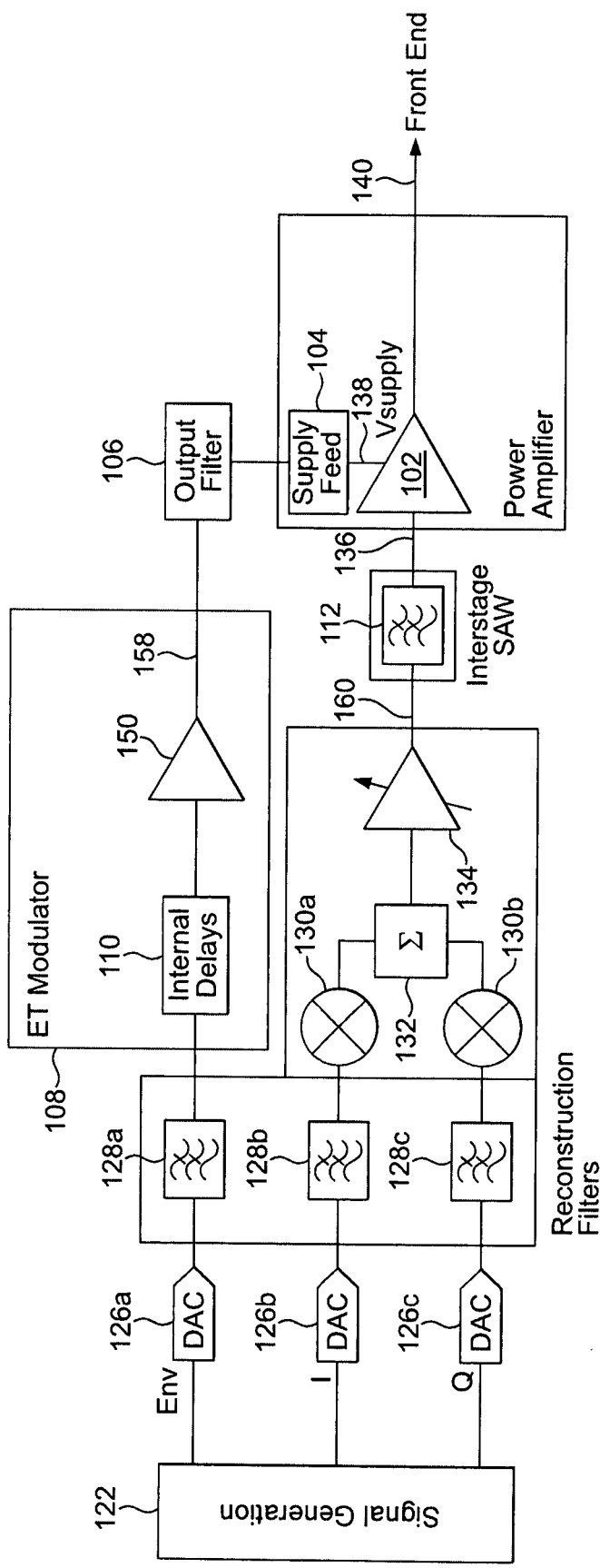
FIG. 1 illustrates an RF amplification stage adapted in accordance with an embodiment of the present invention.

The invention will now be described with further reference to the exemplary RF amplification architecture of FIG. 2, which modifies the arrangement of FIG. 1 in accordance with exemplary embodiments of the invention. The invention, and its embodiments, is not however limited in its applicability to the exemplary architecture and implementation as illustrated in FIG. 2.

Figure 2:
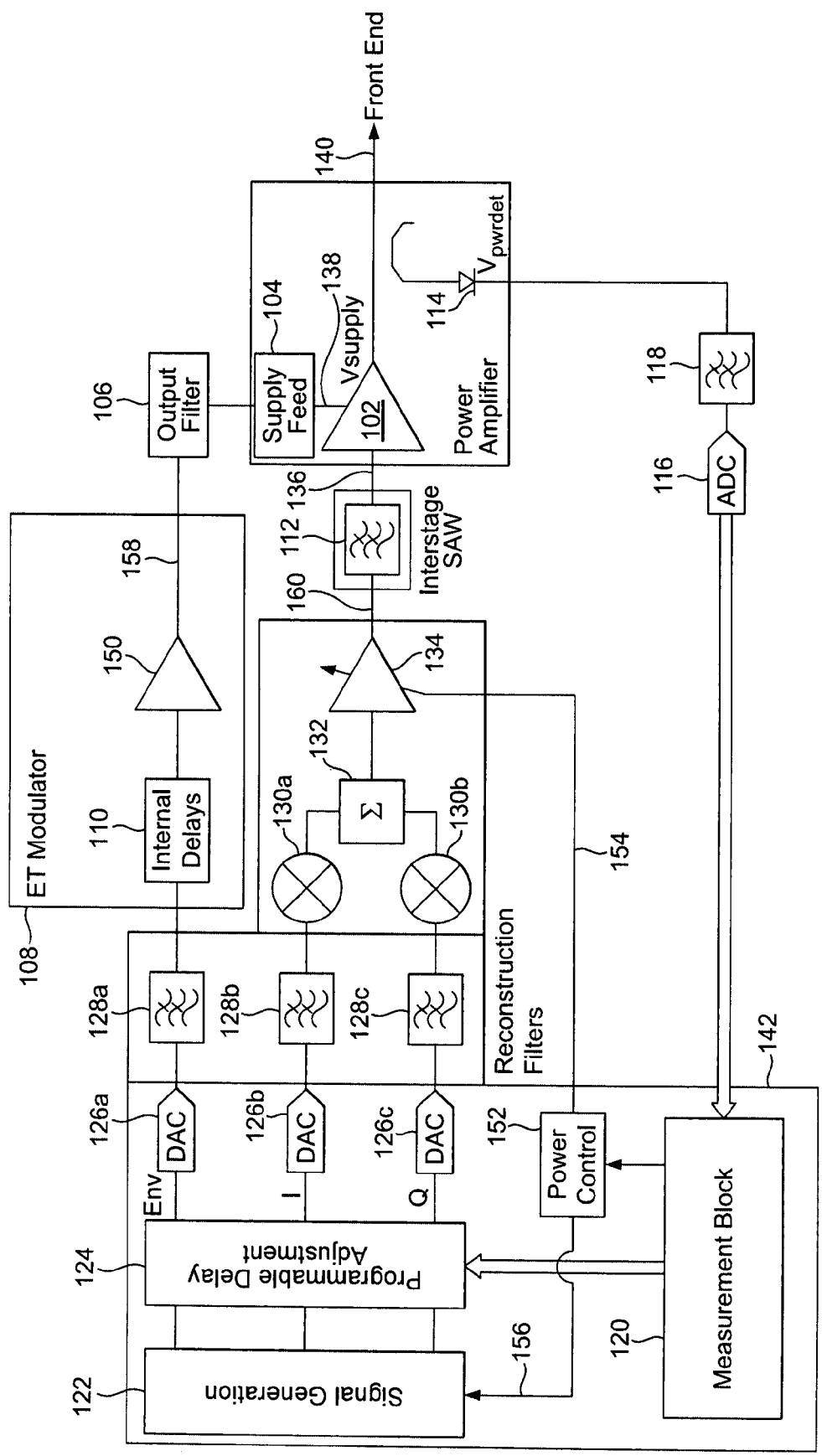
FIG. 2 illustrates a modified RF amplification stage in accordance with a preferred embodiment of the invention.

With reference to FIG. 2, the RF amplification architecture is adapted to include a calibration control stage 142 including the signal generation block 122, a programmable delay adjustment block 124, a measurement block 120, and a power control block in accordance with an exemplary implementation of the present invention.

As illustrated in the embodiment of FIG. 2, the envelope signal, I data signal, and Q data signal for the respective digital-to-analogue converters 126a to 126c are generated by the signal generation block 122 via the programmable delay adjustment block 124. The signal generation block 122 generates signals to the measurement and correlation block 120, and the measurement block 120 generates signals to the programmable delay adjustment block 124.

A diode 114 is connected to the output of the power amplifier 102 on line 140 in order to provide the functionality of a power detector. The diode 114 is further connected to a filter 118, which in turn is connected to an analogue-to-digital converter 116 to provide a digital and filtered representation of the signal detected by the diode 114 to the measurement block 120.

The implementation shown is exemplary, and the invention is not limited to the use of a diode as a power detector to provide feedback to the measurement block 120. In general, the diode 114 represents a functional block for providing a signal representing the amplitude or power of the signal at the output of the RF power amplifier 102 on line 140. In an alternative implementation, the detection could be implemented using a receiver chain including an analogue to digital converter, with detection of the envelope being implemented in the digital domain.

The power control block 152 is connected to receive an input from the measurement block 120, and generate outputs to the signal generation block 122, and the variable gain amplifier 134 of the input path.

The adaptation of an RF power amplification stage in accordance with the exemplary arrangement of FIG. 2 provides for a calibration system that removes the delay and attenuation uncertainty in the envelope path and the RF path to arbitrary precision that can be implemented as a self-calibration. The variation in the delay and amplitude in the input and envelope paths causes a power variation in the output of the amplifier. The point at which the variations between the signals in the envelope and input paths are controlled is denoted by reference numerals 158 and 160 respectively in FIG. 1.

Figure 3:
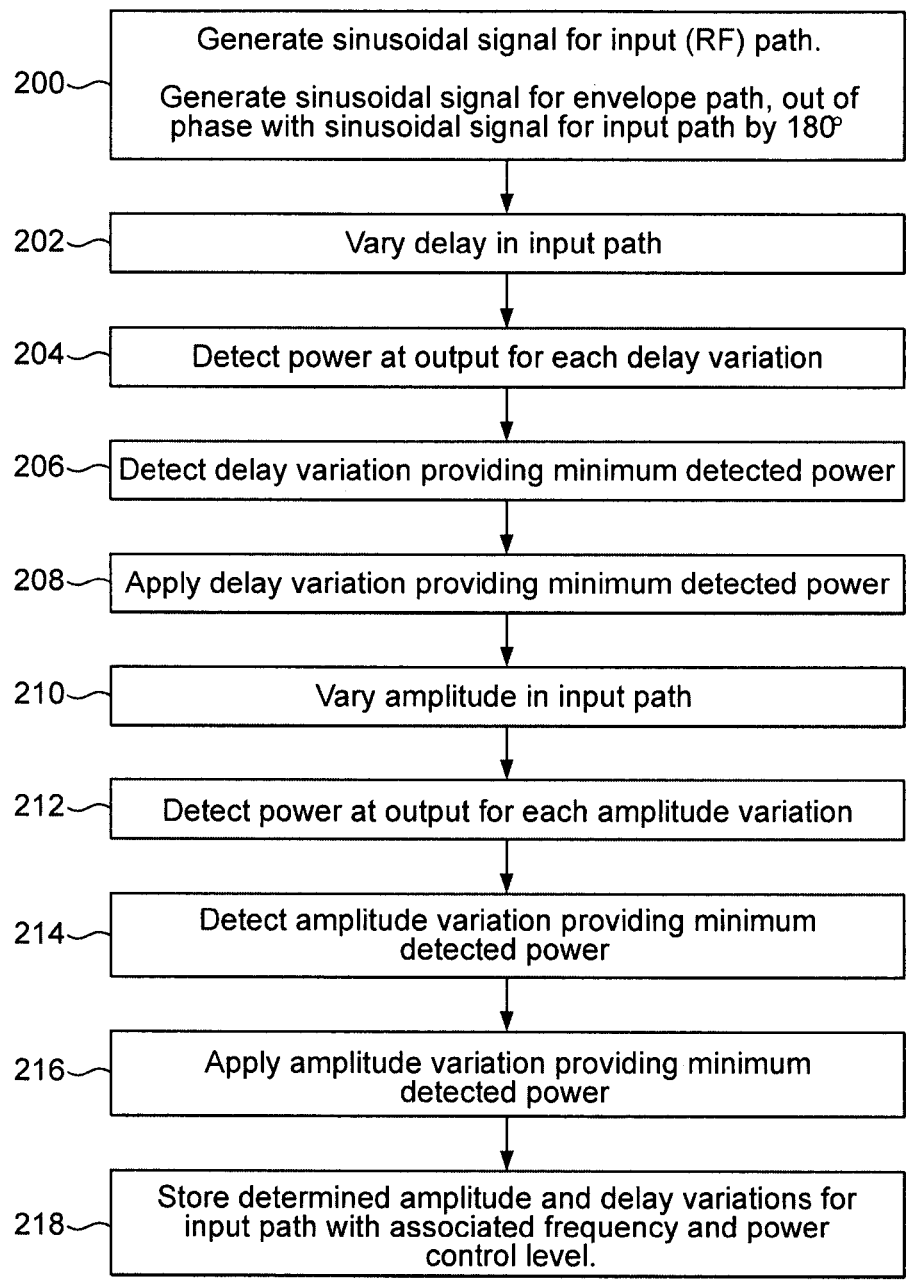
FIG. 3 illustrates the steps in utilising the exemplary RF amplification stage of FIG. 1 in an embodiment of the invention.

The principles of the present invention as exemplified by the arrangement of FIG. 2 are now further described with reference to an exemplary procedure as set out in the flow diagram of FIG. 3.

As denoted in step 200, the signal generation block 122 is arranged to generate sinusoidal signals for the input path and envelope path. The sinusoidal signals for the input and envelope paths are generated independently. The signals are generated to be 180° out of phase with each other. The two sinusoidal signals are preferably also arranged such that in an ideal system their amplitudes would cancel, i.e. to have the same magnitudes. It is assumed that the envelope path is pre-calibrated, in accordance with techniques known in the art, to sufficient accuracy and precision that it does not affect the determination of the amplitude of the envelope signal to ensure that the amplitudes cancel.

In a first phase of a calibration operation, as denoted by step 202 the signal generation block 122 is arranged to apply the generated sinusoidal signal to the envelope path, via the programmable delay adjustment block 124, but with no delay applied. For the entire first phase of operation, the signal applied to the envelope path has no delay applied to it.

The signal generation block 122 is further arranged, as denoted by step 202, to apply the constant amplitude signal to the RF input path via the programmable delay adjustment block 124, with a controlled applied delay. The programmable delay adjustment block 124 is controlled to vary the delay in the sinusoidal signal applied to the input path. Preferably the delay is varied through successive values in successive time periods.

In accordance with the standard operation of the power amplification stage, the constant amplitude signal is processed by the RF input path and amplified by the power amplifier.

The diode detector 114, as denoted by step 204, detects the power at the output of the RF amplifier, which is delivered to the measurement block 122 through the feedback path formed by the diode 114, the filter 118, and the analogue-to-digital converter 116.

The measurement block 120 receives the generated sinusoidal signal applied to the input path and the detected output signal. The detected output signal represents the RF output power. If the signal in the envelope and input paths are correctly aligned in time and amplitude, the output power is a constant level. If they are not correctly aligned, a ripple is present on the output signal. The measurement block measures the peak-to-peak value of the detected output power to determine the size of the ripple. This peak-to-peak determination is made for each successive applied delay, such that a plurality of peak-to-peak values are determined corresponding to the plurality of applied delays. The measurement block 120 then assesses the peak-to-peak values, using standard techniques, to determine the smallest peak-to-peak, and hence the delay value associated with best alignment of the signals, as denoted by step 206.

As denoted by step 208, the delay associated with the smallest peak-to-peak value is then applied in the input path using the programmable delay adjustment block 124.

In a second phase of the calibration process, the signal generation block 122 is adapted to apply the sinusoidal signal to the input path as I and Q signals, via the programmable delay adjustment block 124, with the delay being set to that determined as optimum in the first phase of operation. The signal generation block 122 is further adapted as denoted by step 210 to apply a variable amplitude to the signal in the input path under the control of the power control block 152. The power control block 152 provides amplitude adjustment information on line 156 to the signal generation block 122 and on line 154 to the variable gain amplifier 134 of the input path. Preferably the amplitude is varied through successive values in successive time periods.

In accordance with the standard operation of the power amplification stage, the constant amplitude signal is processed by the RF input path and amplified by the power amplifier. As in the first phase of operation the diode 114 detects the power of the output of the RF amplifier as denoted by step 212, and the detected power is provided to the measurement block 120.

The measurement block 120 receives the generated sinusoidal signal applied to the input path and the detected output signal. A peak-to-peak determination is made for each successive applied amplitude, such that a plurality of peak-to-peak values are determined corresponding to the plurality of applied amplitudes. The measurement block 120 then assesses the peak-to-peak values, using standard techniques, to determine the smallest peak-to-peak, and hence the amplitude value associated with best alignment of the amplitude of the signals in the envelope and input paths, as denoted by step 214.

As denoted by step 216, the amplitude associated with the smallest peak-to-peak value is then applied in the input path using the signal generator or the variable gain amplifier.

After completion of the first and second phases of the correlation process, the measurement block 120 has calculated a delay and amplitude attenuation to be applied in the input path. These values may be stored, and applied in the input path during normal operation, as denoted by step 218.

In a preferred embodiment, where the amplitude variation is being controlled/applied in the input path, the appropriate control/variation is applied in the VGA 134, although this could be applied in the signal generator 122. In a preferred embodiment, where the amplitude variation is being controlled/applied in the envelope path, the appropriate control/variation is applied in the signal generator 122.

It should be noted that the first and second phases of the calibration process may be carried out in any order, such that the second phase may take place before the first phase, i.e. the calibration based on amplitude may be carried out before the calibration based on delay.

The first and second phases of the calibration process may additionally be cycled through a certain number of times to improve the alignment and avoid a local minima.

It should also be noted that in the first and second phases of the calibration process, the signal in the input path may be kept unchanged whilst the delay and attenuation is varied in the envelope path.

The described technique may be implemented as internal self-calibration, avoiding the need for expensive and time-consuming factory calibration.

Since the delay and attenuation information is determined using a relative measurement technique, the uncertainty of the bandwidth in the power detector is removed.

The bandwidth of the signal applied to the RF path in either the first or second phases of the calibration process must lie within the bandwidth of the envelope tracking system.

The invention seeks to minimise the variation in the detected output power for all harmonics or for the fundamental frequency.

As denoted by step 220, the process may be repeated for different frequencies of operation, in order to determine delay and attenuation values to be applied for other frequencies.

Similarly, as denoted by step 222, the process may be repeated for different power control levels at each frequency of operation, in order to determine delay and attenuation values to be applied for other power control levels.

The invention is described herein with reference to particular examples and embodiments, which are useful for understanding the invention and understanding a preferred implementation of the invention. The invention is not, however, limited to the specifics of any given embodiment, nor are the details of any embodiment mutually exclusive. The scope of the invention is defined by the appended claims.

What is claimed is:

1. A method of calibrating an envelope path and an input path of an amplification stage including an envelope tracking power supply, the method comprising:
generating input signals having a known relationship for each of the input and envelope paths;
amplifying the signal in the input path with an amplifier powered by the envelope tracking power supply to generate a signal at an output of the amplification stage;
detecting the power in the signal at the output of the amplification stage; and
varying an amplitude and a delay of the signal in one of the envelope and input paths in order to reduce the variation in the power detected in the signal at the output of the amplification stage.

2. The method of claim 1 further comprising varying the delay in the one path to determine the delay minimising the variation in detected power and varying the amplitude in the one path to determine the amplitude minimising the variation in detected power.

3. The method of claim 2 further comprising varying the amplitude with the delay set at that determined to minimise variation in detected power or varying the delay with the amplitude set at that determined to minimise variation in detected power.

4. The method of claim 2 further comprising repeating each determination.

5. A method of calibrating an envelope path and an input path of an amplification stage including an envelope tracking power supply, the method comprising:
generating input signals having a known relationship for each of the input and envelope paths;
varying an amplitude and a delay of the signal in one of the envelope and input paths in order to reduce the variation in the power detected in a signal at the output of the amplification stage;
varying one of the relative delay or relative amplitude between the paths over a plurality of values;
detecting the power at the output of the amplification stage for each value;
determining the value of the relative delay or relative amplitude which generates the minimum detected output power variation;
applying the determined value;
varying the other of the relative delay or relative amplitude between the paths over a plurality of values;
detecting the power at the output of the amplification stage for each value; and
determining the value of the other of the relative delay or relative amplitude which generates the minimum detected output power variation.

6. The method of claim 5 wherein varying each of the relative delay and the relative amplitude comprises varying the delay and amplitude of the signal in one path whilst applying no variation to the signal in the other path.

7. The method of claim 1 in which the generated input signals for the input and envelope paths are correlated.

8. The method of claim 1 further comprising applying a sinusoidal signal to each of the envelope and input paths, wherein the applied signals in each path are 180° out of phase with each other.

9. The method of claim 1 in which the amplification stage is an RF amplification stage.

10. The method of claim 1 further comprising:
determining the delay and amplitude variations in the one path minimising the variation in the detected output power; and
setting the delay and amplitude variations in the one path corresponding to such.

11. An amplification stage having an input path and an envelope path, the amplification stage comprising:
a signal generator arranged to generate a signal on each of the input and envelope paths, the signals having a known relationship;
an envelope tracking power supply;
an amplifier powered by the envelope tracking power supply and configured to amplify the signal in the input path to generate a signal at the output of the amplifier; and
a detector for detecting the power in the signal at the output of the amplifier, the signal generator being adapted to vary the delay and amplitude of the signal in one of the envelope and input paths in order to reduce the variation in the power detected in the signal at the output.

12. The amplification stage of claim 11 wherein the signal generator is adapted to vary the delay and the amplitude in separate stages of operation.

13. The amplification stage of claim 11 further including a measurement block for measuring the power variation of the output signal.

14. An amplification stage including an amplifier and an envelope tracking power supply, and having an input path and an envelope path, the amplification stage comprising:
a signal generator arranged to generate a signal on each of the input and envelope paths having a known relationship;
a detector for detecting the power in a signal at the output of the amplifier, the signal generator being adapted to vary the delay and amplitude of the signal in one of the envelope and input paths in order to reduce the variation in the power detected in the signal at the output; and
a measurement block for measuring the power variation of the output signal, wherein the signal generator is adapted to generate the signal on one of the input or envelope paths for a plurality of delay values, and the measurement block is adapted to measure the output power variation for each delay value, the measurement block being further adapted to determine the delay value associated with the minimum detected power variation.

15. The amplification stage of claim 14 in which the measurement block is further adapted to apply the determined delay value.

16. An amplification stage including an amplifier and an envelope tracking power supply, and having an input path and an envelope path, the amplification stage comprising:
a signal generator arranged to generate a signal on each of the input and envelope paths having a known relationship;
a detector for detecting the power in a signal at the output of the amplifier, the signal generator being adapted to vary the delay and amplitude of the signal in one of the envelope and input paths in order to reduce the variation in the power detected in the signal at the output; and
a measurement block for measuring the power variation of the output signal, wherein the signal generator is adapted to generate the signal on one of the input or envelope paths for a plurality of amplitude values, and the measurement block is adapted to measure the output variation for each amplitude value, the measurement block being further adapted to determine the amplitude value associated with the minimum detected power variation.

17. The amplification stage of claim 16 in which the measurement block is further adapted to apply the determined amplitude value.

18. The amplification stage of claim 11 wherein the signal generator is arranged to generate the signal on each of the input and envelope paths with a correlation therebetween.

19. The amplification stage of claim 11 wherein the signal generator is arranged to generate a sinusoidal signal on each of the input and envelope paths which are 180° out of phase.

20. The amplification stage of claim 11 further adapted to set the delay and amplitude variations in the one path determined to minimise the variation in the power detected in the output.

* * * * *